March 26, 1968 G. ROSENSTAND 3,375,407
ELECTRONIC MOUNTING UNIT HAVING SPACED PLATE
ELEMENTS SUPPORTED IN POSITION
Filed July 22, 1965

INVENTOR
GERD ROSENSTAND
BY
Nolte & Nolte
ATTORNEYS

United States Patent Office 3,375,407
Patented Mar. 26, 1968

3,375,407
ELECTRONIC MOUNTING UNIT HAVING SPACED PLATE ELEMENTS SUPPORTED IN POSITION

Gerd Rosenstand, Copenhagen, Denmark, assignor to Danavox International A/S, Copenhagen, Denmark Filed July 22, 1965, Ser. No. 474,046
Claims priority, application Denmark, Mar. 26, 1965, 1,577/65
7 Claims. (Cl. 317—101)

ABSTRACT OF THE DISCLOSURE

An electronic mounting unit comprises a pair of spaced parallel plate elements each having holes formed therethrough. A plurality of electronic components is positioned between the plate elements and each has electrical terminals extending therefrom through corresponding ones of the holes formed through the plate elements and affixed in electrical contact with the plate elements. A support and spacing component comprises a rigid housing of box-like configuration with electronic circuitry enclosed within the housing. The housing is positioned between the plate elements with a pair of spaced parallel planar sides thereof abutting the plate elements.

The invention relates to a mounting unit, a so-called chassis, with a number of components, especially for a small hearing aid, and of the type, where the components are placed between two substantially parallel plate elements, at least some of the components being secured to both plate elements, preferably thereby, that the connecting conduits of the components are introduced through holes in the two plate elements and are secured by solderings to said plate elements, which can consist of printed circuit plate elements.

There is known a mounting unit of the type indicated, where a filling-out has been undertaken with epoxy-resin. This gives a very solid structure, which, however, has the drawback, that it is difficult to renew the components.

Furthermore, there is known a mounting unit of the type indicated, where the two plate elements are connected by means of a third plate element so as to form a U-formed structure. However, hereby it is difficult to obtain the necessary strength and stiffness in the mounting unit, and it is difficult to obtain the necessary precision as to the distance between the two plate elements, and the mounting of the components can give difficulties.

The object of the invention is to provide a mounting unit of the type indicated, whereby the said drawbacks are remedied, so that a solid structure is obtained, where it is relatively easy to renew the components. The characteristic features of the mounting unit according to the invention is, that one of the components consists of a so-called integrated circuit amplifier, the housing of which stays and provides a spacing member for the two plate elements.

Other components, especially the so-called passive components, may, according to the invention, provide spacers between the two plate elements. Hereby an especially rigid construction is obtained.

The other components may, according to the invention, be placed in a row, that is parallel to the integrated circuit amplifier. Since the amplifier has the form of a flat casing, a practical buildup of the mounting unit is provided by such casing when positioned between the plate elements.

Figure 1:
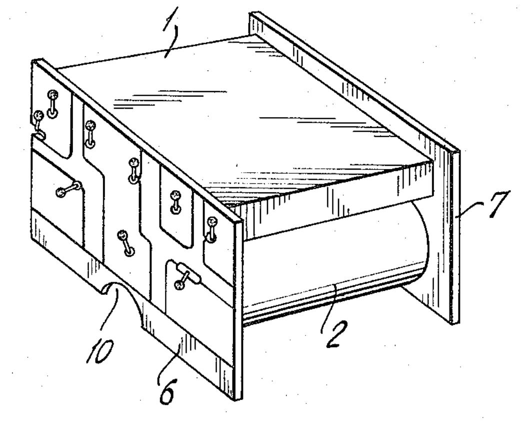
Figure 2:
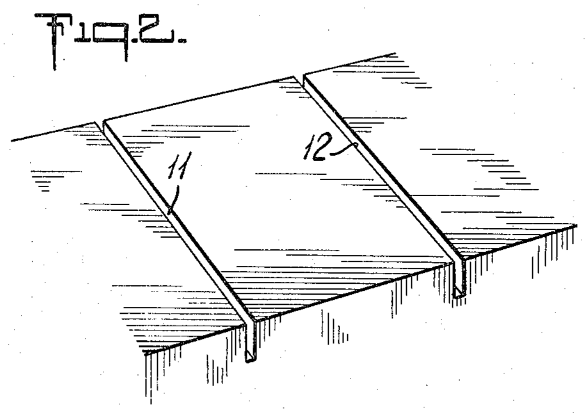
Figure 3:
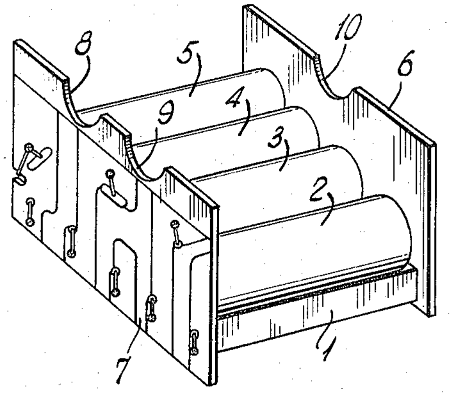

In the accompanying drawing there is shown a mounting unit according to the invention, where FIG. 1 shows a perspective view of the mounting unit, seen from one side, FIG. 2 a housing part, into which the mounting unit can be placed, and FIG. 3 the mounting unit, seen from the other side.

On the drawings a so-called integrated circuit amplifier 1 is shown, which is enclosed in a flat casing, as shown. Different auxiliary components are designated by the numerals 2, 3, 4 and 5. All the components 1–5 are secured between two plate elements 6 and 7, which are provided with printed circuits. The components have, in each end, connecting wires, which are introduced through corresponding holes in the plate elements 6 and 7 and are secured by soldering on the outside of said elements, whereby they are connected to the circuit parts in question of the printed circuits, and whereby they, concomitantly, are secured to the plate element in such a way, that said elements abut the ends of the components. The integrated circuit amplifier has connecting wires, which extend outwards through an insulated projection, for example made of glass, and these projections protrude into the holes in the plate elements 6 and 7 and give an effective anchoring.

Incisions may be provided in the edges of the plate elements.

One of the plate elements has two incisions 8 and 9 and the other plate element has one incision 10. The incisions may be used to ensure the correct positioning in auxiliary tools when mounting.

The mounting unit can be secured in a housing, the plate elements 6 and 7 being introduced into grooves 11 and 12 in the housing.

The shown and described embodiment is only to be considered as an example. Thus two or more integrated circuit amplifiers may be positioned between the plate elements 6 and 7.

What is claimed is:

1. An electronic mounting unit adapted for use in small hearing aids, said mounting unit comprising a pair of spaced substantially parallel plate elements each having holes formed therethrough; a plurality of electronic components positioned between said plate elements and each having electrical terminals extending therefrom through corresponding ones of the holes formed through said plate elements and affixed in electrical contact with said plate elements, at least some of said electronic components being affixed to both of said plate elements; and a support and spacing component comprising a rigid housing of substantially box-like configuration having a first pair of spaced substantially parallel planar sides of large area and a second pair of spaced substantially planar sides of small area compared to that of said first pair of sides and perpendicular to said first pair of sides and electronic circuitry enclosed within said housing and positioned between and affixed to said plate elements with the second pair of sides thereof abutting said plate elements.

2. An electronic mounting unit as claimed in claim 1, wherein the electronic circuitry within the housing of said support and spacing component is an integrated amplifier circuit.

3. An electronic mounting unit as claimed in claim 1, wherein the housing of said support and spacing component has length and width dimensions and a depth dimension which is considerably smaller than said length and width dimensions, each of the sides of said second pair of sides being bounded by the depth dimension and one of the length and width dimensions.

4. An electronic mounting unit as claimed in claim 1, wherein the housing of said support and spacing component has length and width dimensions and a depth dimension which is considerably smaller than said length and width dimensions and wherein said electronic components are positioned substantially parallel to said support and spacing component extending along one of said length and width dimensions.

5. An electronic mounting unit as claimed in claim 1, wherein said plate elements have edges with incisions formed in said edges.

6. An electronic mounting unit as claimed in claim 1, wherein said plate elements have edges with a determined number of spaced incisions formed in an edge of one of said plate elements and a different number of incisions formed in an edge of the other of said plate elements.

7. An electronic mounting unit as claimed in claim 4, wherein said plate elements have edges with a determined number of spaced incisions formed in an edge of one of said plate elements and a different number of incisions formed in an edge of the other of said plate elements.

References Cited

UNITED STATES PATENTS

| | | | |
|---|---|---|---|
| 3,151,277 | 9/1964 | Gray | 317—101 |
| 3,304,468 | 2/1967 | Lawson | 317—101 |
| 3,132,288 | 5/1964 | Talentinow et al. | 317—101 |
| 3,151,278 | 9/1964 | Elarde | 317—101 |
| 3,247,575 | 4/1966 | Parstorfer | 317—101 |

ROBERT K. SCHAEFER, *Primary Examiner.*

ROBERT S. MACON, *Examiner.*

J. R. SCOTT, *Assistant Examiner.*